United States Patent [19]

Esser

[11] Patent Number: 4,903,284
[45] Date of Patent: Feb. 20, 1990

[54] ACCORDION-TYPE CHARGE-COUPLED DEVICES

[75] Inventor: Leonard J. M. Esser, Eindhoven, Netherlands

[73] Assignee: U.S. Philips Corp., New York, N.Y.

[21] Appl. No.: 123,697

[22] Filed: Nov. 23, 1987

[30] Foreign Application Priority Data

Nov. 27, 1986 [NL] Netherlands ............... 8603007

[51] Int. Cl.⁴ ............... H04N 3/14; H01L 29/78; H01L 27/10; G11C 27/04
[52] U.S. Cl. ............... 377/62; 377/54; 377/58; 358/213.26; 357/24
[58] Field of Search ............... 377/57, 54, 58, 78, 377/60–63, 69; 357/24, 24 LR; 358/213.23, 213.24, 213.25, 213.29, 213.31, 213.18, 213.26

[56] References Cited

U.S. PATENT DOCUMENTS

| | | | |
|---|---|---|---|
| 3,801,884 | 4/1974 | Seguin | 377/57 |
| 4,178,614 | 12/1979 | Sauer | 358/213.26 |
| 4,314,275 | 2/1982 | Chapman | 358/213.26 |
| 4,574,313 | 3/1986 | Battson | 358/213.26 |
| 4,603,355 | 7/1986 | Yamada et al. | 358/213.29 |
| 4,668,990 | 5/1987 | Kondo et al. | 358/213.29 |
| 4,677,650 | 6/1987 | Boudewijns et al. | 377/63 |
| 4,723,168 | 2/1988 | Theuwissen | 358/213.31 |
| 4,745,481 | 5/1988 | Tanaka | 358/213.29 |

FOREIGN PATENT DOCUMENTS 0116027 10/1978 Japan ............... 358/213.29
0195371 11/1983 Japan ............... 358/213.29

OTHER PUBLICATIONS

Theuwissen et al., "The Accordion Imager: An Ultra High Density Frame Transfer CCD" Technical Digest IEDM–1984–pp. 40–43.
Mitani et al.–"A Single Chip ½ Frame Transfer CCD Color Image Sensor" International Electron Devices Meeting–1984–pp. 44–47.

Primary Examiner—John S. Heyman
Assistant Examiner—Tai Van Duong
Attorney, Agent, or Firm—Steven R. Biren

[57] ABSTRACT

The invention relates to a charge-coupled device of the accordion type provided with a shift register for supplying accordion clock voltages on the one hand and with clock lines for supplying conventiional clock voltages on the other hand. The electrodes are alternatively coupled to the shift register and to the clock lines. The dissipation can be considerably reduced in this device. Moreover, the transport direction can be reversed in a simple manner, which is of importance, for example, in image sensors for smear suppression.

6 Claims, 9 Drawing Sheets

ACCORDION-TYPE CHARGE-COUPLED DEVICES

BACKGROUND OF THE INVENTION

The invention relates to a charge-coupled device comprising a charge transport channel defined in a semiconductor body and an electrode system for controlling the transport of charges through the charge transport channel, a shift register being provided, by means of which such voltages can be applied to the electrode system that during the storage of charge packets the device is operated as an m-phase device and is operated during transport as an n-phase device (n being larger than m), while a charge packet does not participate in the transport until the preceding charge packet has already been displaced over a certain distance.

Such a device is known inter alia from the article "The Accordion Imager: An Ultra-High-Density Frame Transfer CCD" by A. J. P. Theuwissen et al, published in "Technical Digest IEDM" (1984), p. 40/43. In this publication an image sensor of the frame transfer type is described. During the integration period, the sensor section is operated as a 2-phase device, at every other electrode a potential well being induced in which photo-current is integrated. The intermediate electrodes act as barrier electrodes between the potential wells. During the transport the device is operated as a 4-phase device, while, in order to prevent packets of charge being joined together, first only the first image line is displaced until the distance from the second image line is sufficiently large, after which simultaneously the first and second image lines can be displaced over a certain distance, etc. The image lines are therefore not displaced simultaneously from the beginning of the transport, but each time a new image line is added to the transport when the distance from the preceding image line allows it. In a similar manner, the information in the memory section can be telescopically compressed, while at every other electrode again a charge packet is stored.

In order to apply to the electrodes successively clock voltages or a d.c. voltage, use is made of one or more shift registers. The outputs of the separate stages of the shift register can be directly connected to the electrodes, as is described, for example, in the aforementioned publication, or can be coupled to a series of switches, through which the electrodes can be connected either to clock lines or to d.c. lines, as is described, for example, in the Netherlands patent application No. 8301977, which corresponds to U.S. patent application Ser. No. 615,843.

In these known CCD's of the accordion type, the electrodes are in principle equivalent to each other, at least during the charge transport, that is to say that each electrode acts as a charge storage electrode and a clock voltage of, for example, 10 V is applied to each electrode. In given applications, more particularly with large CCD's, a clock system having a comparatively low dissipation may be desirable. An object of the invention is therefore to provide an accordion CCD of the kind described above, which can be operated so that the dissipation is lower than in the known accordion CCD's with unchanged storage capacity.

Due to the fact that moreover in the known CCD's each electrode is associated with a stage of a shift register, technical problems with respect to designing are liable to arise during the manufacture of the device because the pitch between the stages of the shift register and the pitch between the electrodes of the charge-coupled device generally do not correspond to each other. In general solutions have to be found which require a comparatively large amount of space, more particularly due to the wiring from the shift registers to the electrodes. A further object of the present invention is therefore to provide an accordion CCD with simpler designing rules than the known device.

In certain cases, more particularly in image sensors intended to convert radiation images into electrical signals, it may be desirable to reverse the transport direction, as described, for example, in the co-pending Netherlands Patent Application "CCD image sensor arrangement", which corresponds to U.S. patent application Ser. No. 282,848.

A further object of the invention is therefore to provide an accordion CCD, in which the transport direction can be reversed in a simple manner.

SUMMARY OF THE INVENTION

A charge-coupled device according to the invention is characterized in that only a subgroup of the electrode system is coupled to the shift register comprising electrodes in alternation with electrodes which are conductively connected to a source common to at least a number of electrodes.

As will appear from the description of the Figures, the electrodes connected to the common clock line can be used as transfer electrodes and the electrodes forming part of the said subgroup can be used as storage electrodes. Due to the fact that the voltage jump of the clock voltage at the transfer electrodes can be small, for example need be only one fifth of the voltage jump of the clock voltage at the storage electrodes, the dissipation in a device according to the invention can be considerably reduced.

Due to the fact that further only every other electrode need be coupled to the shift register, a considerable reduction of the designing problems described above and/or a reduction of the wiring is obtained.

As will appear from the following description, the transport direction can be reversed in a very simple manner, for example by means of synchronization of the clock voltages to be applied.

BRIEF DESCRIPTION OF THE DRAWING

The invention will be described more fully with reference to several embodiments and the accompanying diagrammatic drawing, in which.

DESCRIPTION OF THE PREFERRED EMBODIMENTS

Figure 1:
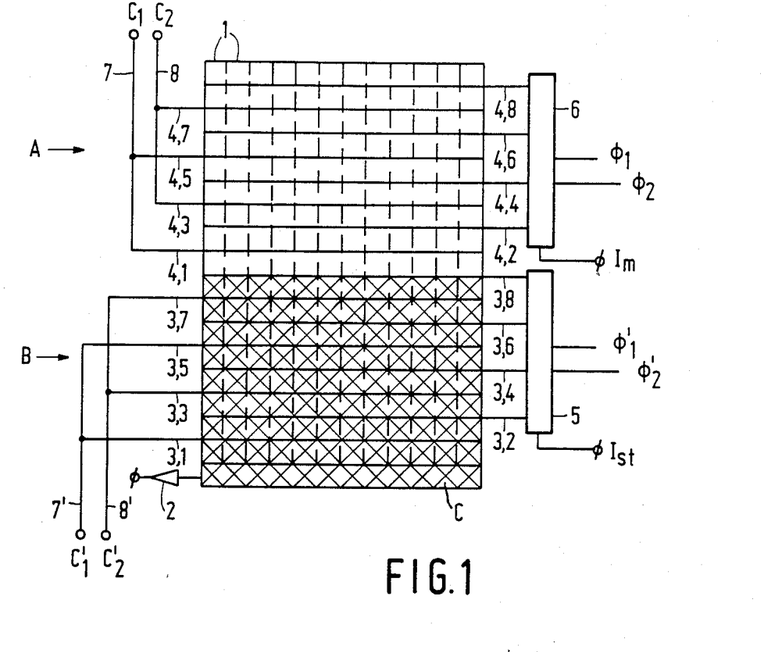
FIG. 1 shows a diagrammatic representation of a charge-coupled image sensor arrangement according to the invention.

FIG. 1 shows the circuit diagram of an accordion FT sensor according to the invention. FT sensors in themselves are generally known with regard to both their construction and their operation and have already been described in a large number of publications. Therefore, those parts and aspects which the present invention has in common with conventional constructions will not be described in detail hereinafter. For these details reference is made to the literature.

The arrangement shown in FIG. 1 comprises a system of adjacent parallel charge-coupled devices having charge transport channels indicated by broken lines. The transport direction extends in principle from top to bottom. The series of CCD's comprises an image sensor section A, of which the surface is accessible for incident radiation, and a storage section B which is shielded, for example, by an Al shielding layer, against incident radiation, as shown in the drawing diagrammatically by cross-hatched lines. On the lower side of the B section, as usual, a horizontal read-out register C is arranged, of which the output is connected to an amplifier 2, at whose output the output signals can be derived. In general, the series register C is also shielded against incident radiation.

For controlling the storage and the transport of the information, the arrangement is provided with an electrode system 3 for the storage section and an electrode system 4 for the sensor section. The series register C may be provided with a conventional 2-, 3- or 4-phase electrode system, which is not shown for the sake of clarity of the drawing. The electrode systems 3 and 4 each comprise a series of electrodes which are designated by reference numerals 3,i and 4,i, respectively, the subscript i, which indicates the number assigned to the electrode, being used to distinguish the electrodes from each other.

For operating the arrangement in the accordion mode described above, besides the mat of CCD's shift registers 5 and 6 are provided, by which, depending upon the input signals Im and Ist, clock voltages can be applied in a desired order of succession to the electrode systems 3 and 4. In contrast with the known accordion sensor, however, not every electrode is connected to the associated shift register, but only half the number of electrodes are connected thereto, more particularly the electrodes provided with an even subscript, so the electrodes 3,2; 3,4; 3,6 etc. and the electrodes 4,2; 4,4; 4,6 etc. The intermediate electrodes, so the electrodes provided with an odd subscript, are connected to at least one, in the present embodiment two clock lines 7,8 and 7', 8', via which a voltage common to a number of electrodes can be applied at any instant during operation.

Since only half the number of electrodes are coupled to one of the shift registers, while the remaining electrodes are conductively connected to one or more conductor tracks, a considerable simplification can be attained in designing the arrangement. Due to the fact that further the maximum voltage jump of the clock voltages $C_1$, $C_2$ to be applied to the clock lines 7,8 and the clock voltages $C_{1'}$, $C_{2'}$ applied to the lines 7' and 8', respectively, are small, as will be explained more fully hereinafter, the dissipation is also kept at a comparatively low level.

Figure 2:
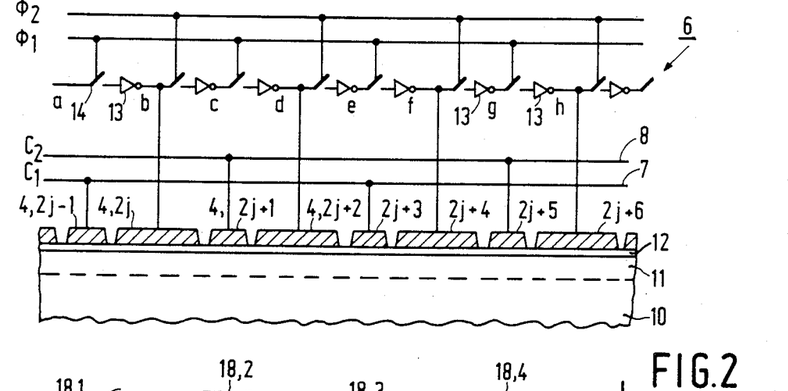
FIG. 2 is a sectional view of a part of the sensor section of this arrangement.

FIG. 2 is a diagrammatic sectional view of a part of the arrangement along a charge transport channel 1. The device is manufactured in a semiconductor body of a suitable semiconductor material, for example Si, which comprises in the case of an n-channel device a p-type surface region 10. The charge-coupled device may be of the so-called surface type or, as is mostly the case in image sensors, of the buried channel type, for which purpose a thin n-type doped layer 11 is formed at the surface. The boundary between the p-type region 10 and the n-type region 11 is indicated in FIG. 2 by broken lines.

The clock electrodes 3 of the storage section and the clock electrodes 4 of the sensor section, shown only in part in the drawing, are provided on the surface so as to be separated therefrom by a thin gate dielectric 12. In order to distinguish them from each other, the electrodes shown are provided with the subscripts $2j-1$, $2j$, $2j+1$, $2j+2$ etc. The electrodes with a subscript $2j$, $2j+2$ (j being an integer) are connected to the outputs of the shift register 6 shown block diagrammatically above the arrangement. The electrodes with an odd subscript $2j-1$, $2j+1$ etc are connected to one of the clock lines 7,8.

In this embodiment, the shift register 6 is constituted by a chain of inverter circuits, 13, which are interconnected through the switches 14. Every other inverter 13 is connected to a clock electrode. The switches 14 are driven by two clock voltages $\phi_1$ and $\phi_2$ (2-phase shift registers). As a matter of course, other known shifter registers may also be used. For example, the shift register may also be composed of non-inverting stages. Instead of 2-phase shift registers, 3- or 4-phase registers may also be used.

Figure 5:
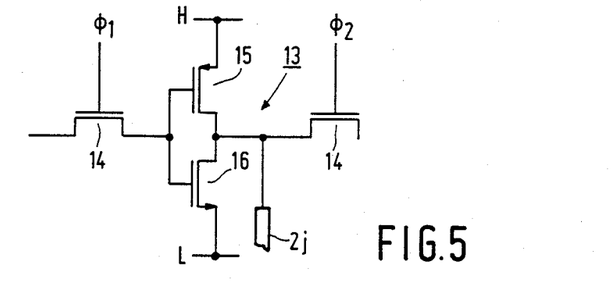
FIG. 5 shows a stage of a shift register that can be used in the arrangement shown in FIG. 1.

FIG. 5 shows a possible embodiment of a stage of the shift register 6. The inverter stage mainly consists of a CMOS pair comprising a p-MOS transistor 15 and an n-MOS transistor 16 connected in series between a high voltage level H and a low voltage level L. The input of the inverter 13 constituted by the gate electrodes of the transistors 15, 16 is connected to one of the source-/drain regions of the switch 14 comprising an insulated gate field effect transistor. The switches 14 are switched on and off by the clocks $\phi_1$, $\phi_2$ applied to the gate electrodes. The output of the inverter constituted by the junction point between the transistors 15, 16 is connected to a transistor (MOST) 14 and may be connected on the other hand to a clock electrode of the CCD indicated diagrammatically by the clock electrode $2j$. Depending upon which of the two transistors 15, 16 is conducting, the voltage H or the voltage L is applied to the electrodes $2j$, $2j+2$ etc.

Figure 3:
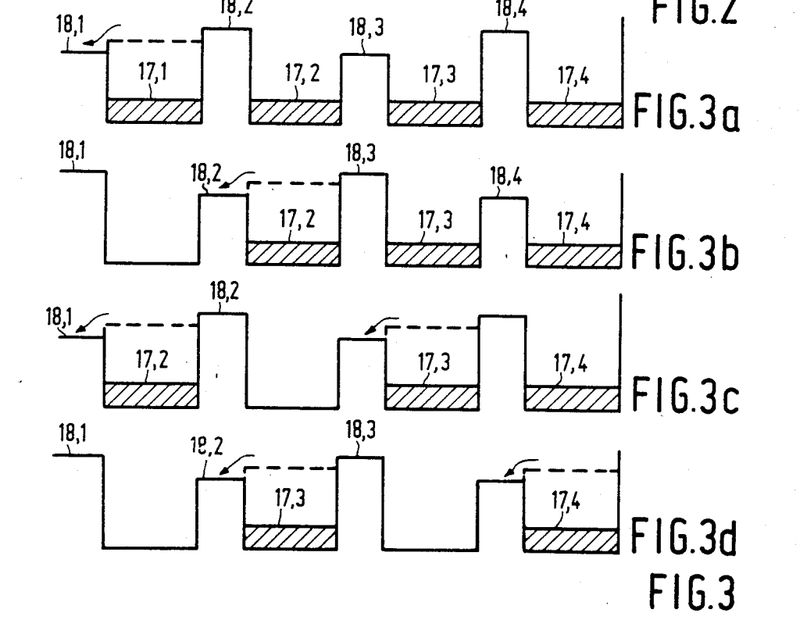
FIG. 3 shows the potential distribution at a number of instants during operation in the part of FIG. 2.
Figure 4:
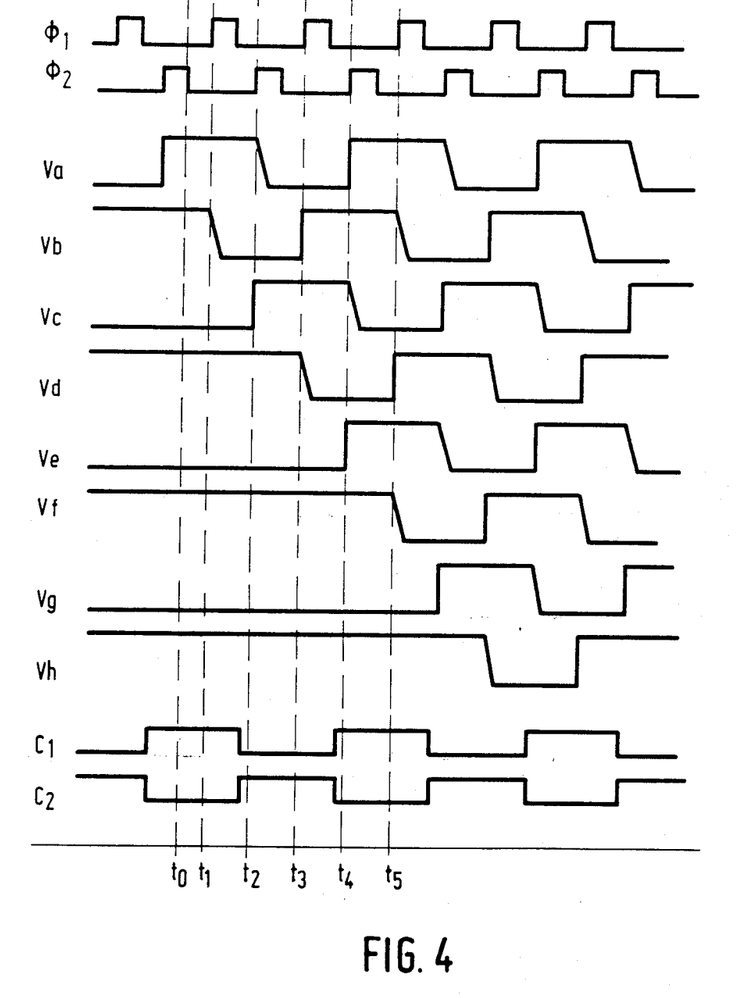
FIG. 4 shows the associated clock voltages as a function of time.

In FIG. 2 the outputs of the various inverters 13 are provided, in order to distinguish them from each other, with the reference symbols a, b, c, d etc. In FIG. 4 the voltages are shown which occur during the charge transport at the various points a, b, c, d etc., indicated by reference symbols Va, Vb, Vc, etc. In FIG. 4, the clock voltages $\phi_1$, $\phi_2$, $C_1$ and $C_2$ are also shown. In FIG. 3 the associated potential profile occurring during the charge transport in the part of the charge transport channel shown in FIG. 2 is represented, the positive potential being plotted in downward direction, as is usual in n-channel devices. In this drawing the full line always indicates the situation in which the voltage H is applied to the electrodes 2j, 2j+2, 2j+4 etc.; the broken line indicates the potential when the voltage at the associated electrode is L.

In FIG. 3a, the full line indicates the situation after an integration period, in which a signal charge 17, indicated symbolically by the cross-hatched line, is stored below the electrodes 2j, 2j+2, 2j+4 etc. The signal charges 17,1; 17,2; 17,3; etc. are mutually separated by potential barriers corresponding to the clocks $C_1$ and $C_2$. Due to the fact that $C_1$ is higher at $t_o$ than $C_2$ (cf. FIG. 4), the barrier 18,1 at the lefthand edge of the signal charge 17,1 is lower than the barrier 18,2 on the righthand side of this signal charge. At $t_1$ the first switch 14 in FIG. 2 becomes conducting by a $\phi_1$ pulse, as a result of which the input voltage at the first inverter 13 varies (becomes high). The output of this inverter becomes L, as a result of which the potential level in the foremost potential well rises (broken line in FIG. 3a). The charge 17,1 flows over the lowest barrier, i.e. over the barrier 18,1, to the potential well (not shown) on the lefthand side of the drawing. The barrier 18,2 should be so high that transport over this barrier to the right is prevented. In order to limit the voltage jump in the clocks $C_1$ and $C_2$, the shift register 6 is preferably dimensioned so that the trailing edges Vaa, V1, Vc etc. have an inclined part, as a result of which the level of the potential wells rises sufficiently slowly to cause the charge to flow to the left over the low barrier 18,1 without the potential level in the charge packet exceeding the level of the potential barrier 18,2. The said inclined part can be obtained in a very simple manner by dimensioning of the transistors 15, 16, for example by choosing the width of the p-channel transistor 15 to be considerably larger than that of the transistor 16. Thus, a comparatively small voltage jump of, for example, 1 V with a voltage difference of 10 V between the levels H and L is sufficient for the clock voltages $C_1$ and $C_2$. When the electrodes have the same surface areas, this means that the dissipation for the electrodes 2j−1, 2j+1, 2j+3 etc., which is proportional to the square value of the voltage jump, is about 25 times lower than the dissipation for driving the electrodes 2j, 2j+2, 2j+4. In practice, this difference can be further increased in that the electrodes 2j−1, 2j+1 etc., which act only as transfer electrodes, are made as small as possible.

It should be noted that at $t_1$ only the charge packet 17,1 is transferred. The voltages at the junction points c, d, e, f etc. do not vary at $t_1$ because the switches driven by $\phi_2$ do not become conducting. The signal charges 17,2; 17,3 etc. thus do not change their places.

At $t_2$ (FIG. 4), $C_1$ becomes low and $C_2$ becomes high. The potential barriers 18,1; 18,3; 18,5 (FIG. 3) then become high; the barriers 18,2; 18,4 etc. become low. Subsequently, $\phi_2$ produces a pulse, as a result of which the signal L at the point b is transferred to the input of the second inverter. Vc (FIG. 4) then becomes H. At $t_3$, $\phi_1$ produces a pulse, as a result of which this high signal is transferred to the next inverter and is inverted so that at the instant Vd becomes low and hence also the voltage at the electrode 2j+2 also becomes low, which is indicated in FIG. 3b by the broken line. The packet 17,2 is transferred to the empty well intended for it. At the same time, preceding charge packets not shown, such as the charge packet 17,1, can also be transported further.

At $t_4$ (FIG. 4), $C_1$ and $C_2$ are offset again, while shortly thereafter $\phi_2$ produces a pulse, as a result of which Vc and Ve vary. At the next $\phi_1$ pulse ($t_5$), these variations are passed on to and inverted by the associated inverters, as a result of which the clock voltages $V_{b'}$ and $V_f$ both become low. The charge packets 17,2 and 17,3 are now shifted one position to the left again simultaneously with the charge packet 17,1 not shown any more. In a next stage, indicated in FIG. 3d by broken lines, the charge packet 17,4 also participates in the charge transport.

In this manner, all the signal charges present in the sensor section can be transported to the storage section. It should be noted that for the charge storage (cf. FIG. 3a) the sensor section is operated as a 2-phase CCD and for the transport (cf. FIG. 3d) it is operated as a 4-phase CCD. The 2-phase mode of operation for the storage has the advantage that during the recording of an image each photosensitive element corresponds to only two electrodes, which, as is known, results in a high resolution. When the charge packets are caused to participate not all at a time, but gradually, in the transport, it is prevented that packets are joined together during the transport, as a result of which information would be lost.

Figure 6:
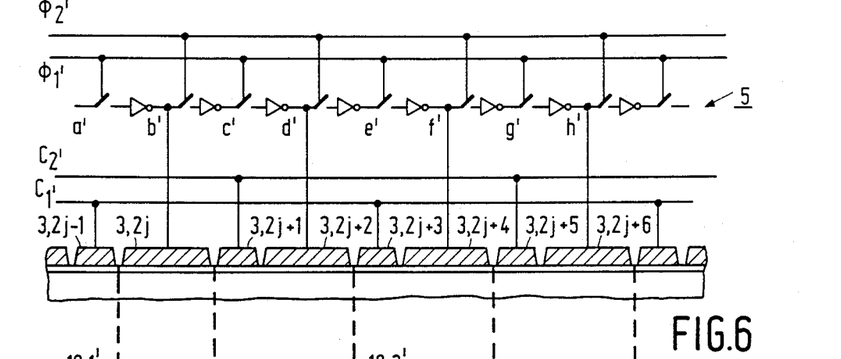
FIG. 6 is a sectional view of a part of the storage section of this arrangement.
Figure 7A:
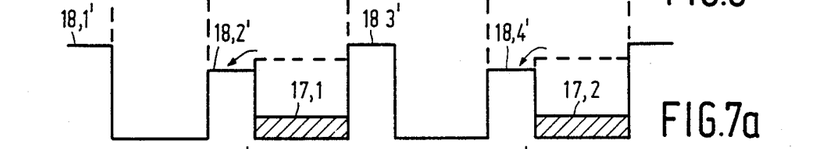
FIG. 7 shows the potential distribution at a number of instants during operation in this part of the arrangement.
Figure 7B:
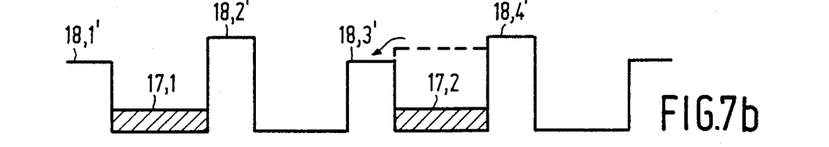
Figure 7C:
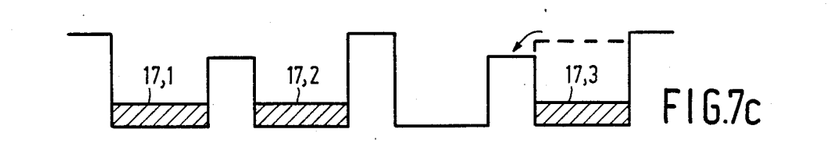
Figure 7D:
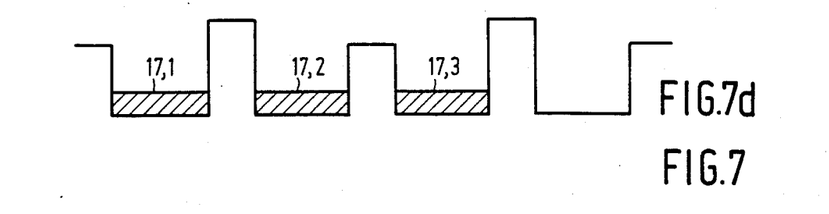
Figure 8:
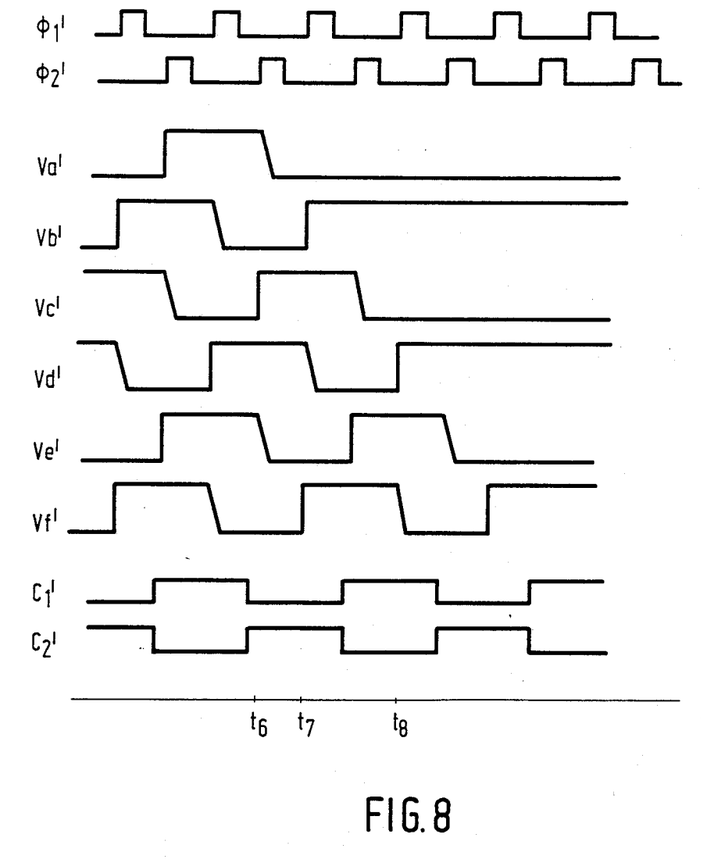
FIG. 8 shows the associated clock voltages as a function of the time t.

In a similar manner as during the transport from the sensor section to the storage section, the information in the storage part can be telescopically compressed again and can be stored according to the 2-phase mode. In order to illustrate this, FIG. 6 shows a part of a CCD in the storage section. FIG. 7 shows associated potential distributions during operation when voltages are applied, which are represented as a function of the time t in FIG. 8. The shift register 5 is identical with regard to its construction to the shift register 6 of the sensor section. The outputs of the various inverters are provided with the reference symbols a', b', c'. The value of the voltages applied corresponds to that of the sensor section. In the time interval preceding $t_6$ (FIG. 8), the voltage still varies at all the points shown in the drawing by a 4-phase mode of operation. At $t_6$, Va' varies from H to L and does not vary any more from this instant, as a result of which the accordion is compressed again. At $t_7$ ($\phi_1$, pulse), the last variation of Va' is converted into the jump L→H of Vb', as a result of which the voltage H, which then does not vary any more, is applied to the clock electrode 3,2j. Below the electrodes 3, 2j+2, 3, 2j+6, the charge packets 17,1; 17,2 have meanwhile arrived according to the 4-phase transport mechanism described hereinbefore. At the instant $t_7$, Vd' and Vh' and hence also the voltages at the electrodes 2j+2; 2j+6 become low (L), while $C_{1'}$ is low and $C_{2'}$ is high. The potential at the area of the packets 17,1; 17,2 increases to the level indicated in FIG. 7a by broken lines, as a result of which the packets are shifted one position to the left over the barriers 18,2' and 18,4'. The charge packet 17,1 has now been stored below the electrode 3,2j and will remain there until Va' varies again in order to shift the packet 17,1 to the horizontal read-out register C. The charge packet 17,2 now has arrived below the electrode 3,2j+4 (FIG. 7b). At the instant $t_8$, Vd' and hence also the electrodes 3,2j+2 become high again, while at the same time Vf' becomes low (L). Due to the fact that $C_{1'}$ is high and $C_{2'}$ is low, the barriers 18,3' and 18,4' are low and high, respectively. The charge packet 17,2 can now flow below the electrode 3,2j+2. Since the voltage at the electrode 3,2j+2 does not vary any more, at least does not vary before the voltage at the electrode 3,2j has varied, the packet 17,2 remains below the electrode 3,2j+2. In an analogous manner, in a next stage (FIG. 7c and FIG. 7d) the charge packet 17,3 is stored below the electrode 3,2j+4. When the whole charge pattern generated in the sensor section has been transferred, at every other electrode a charge packet is stored again in the storage section according to a 2-phase mode. Information charge is then not stored any longer in the sensor section. When, for example, the input signal Im at the input of the shift register 6 is not varied any longer, the charge transport in the sensor section can be stopped in the same manner as described with reference to FIGS. 6–8, while below the electrodes 4,2, 4,4, 4,6 etc. a potential well is induced, in which signal charge can be stored again. The clock voltages $C_1$, $C_2$ can be stopped during the recording of the next frame, while the storage section is read out likewise in known manner with respect to the horizontal read-out register.

Figure 9:
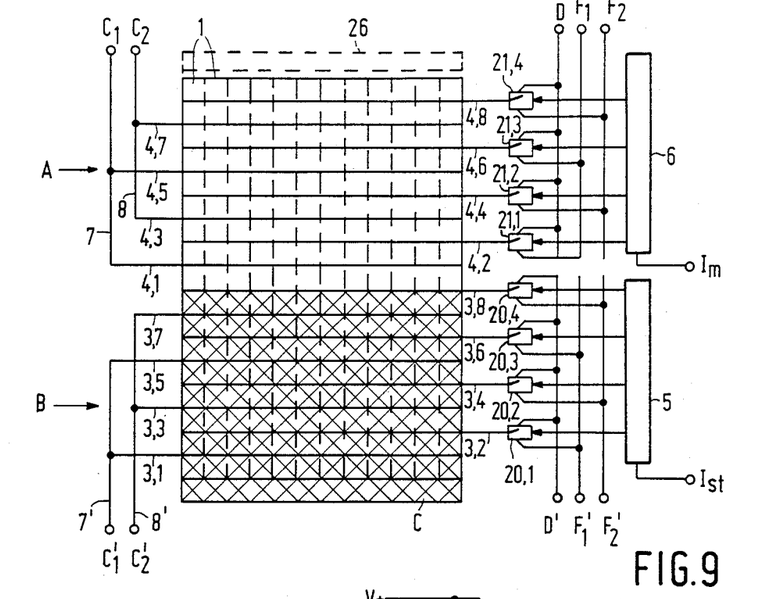
FIG. 9 shows a circuit diagram of a second embodiment of a charge-coupled image sensor arrangement according to the invention.
Figure 10:
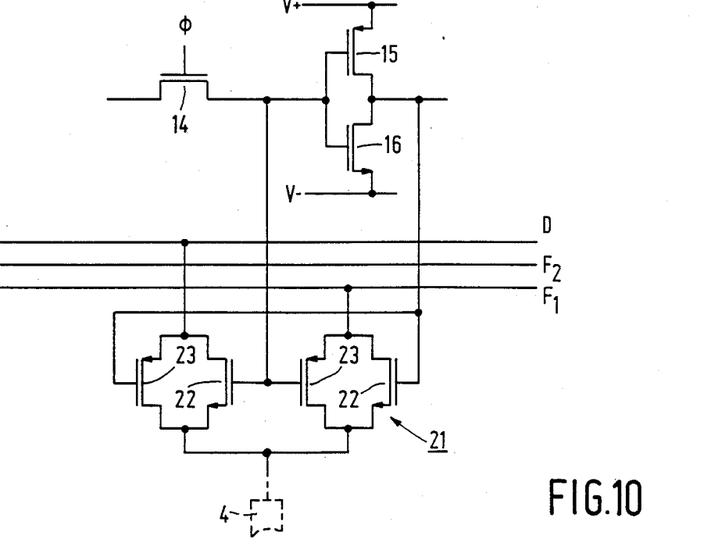
FIG. 10 shows the circuit diagram of a stage of a shift register to be used in this arrangement and the associated switch.

FIG. 9 shows a block circuit diagram of a second embodiment of an arrangement according to the invention. The sensor is identical with regard to the A, B and C sections to the sensor described above. The clock electrodes 3,1; 3,3; 3,5; etc. of the storage section and the clock electrodes 4,1; 4,3; 4,5 etc. of the sensor section are connected, like in the preceding embodiment, to the clock lines 7', 8' and 7,8 respectively. The intermediate electrodes 3,2; 3,4; 4,2; 4,4; 4,6 etc. are not connected, like in the preceding embodiment, directly to the shift register 5 and 6, respectively, but are now connected indirectly thereto through switches 20,21, which are controlled by the shift registers 5 and 6, respectively. The switches 20,21 connect the associated clock electrodes either to one of the clock lines $F_1$, $F_2$ ($F_{1'}$, $F_{2'}$), through which alternating voltages can be applied to the electrodes, or to the line D (D'), through which a d.c. voltage can be applied. FIG. 10 shows a possible embodiment for these switches. Moreover, this Figure shows a stage of the shift register 6 (5), which can be constructed in the same manner as the shift register in the preceding embodiment with a CMOS inverter stage 15,16 and an n-MOST switch 14. The switch 21 comprises two transmission gates each having an n-channel MOS transistor 22 and a p-channel MOS transistor 23. The righthand transmission gate (22,23) connects the associated electrode 4 (or 3 for the storage section) to the associated clock line, by way of example in the drawing to $F_1$; the lefthand transmission gate connects the electrode 4 (3) to the d.c. line D. The input of the inverter stage 15,16 is connected to the p-channel MOST 23 of the righthand transmission gate and to the n-MOST 22 of the lefthand transmission gate. The output of the inverter stage is connected to the n-MOST of the righthand transmission gate and to the p-MOST of the lefthand transmission gate. When the input signal (supplied via the switch 14) is low (L), the output of the inverter 15,16 is high (H). In this condition, the transistors 22,23 of the righthand transmission gate are con-ducting and connect the electrode 4 to the clock line $F_1$. In the reverse condition, in which the input signal of the inverter stage 25,26 is high (H) and the output is low, only the transistors of the lefthand transmission gate are conducting and connect the clock electrode 4 to the d.c. line D. When via the shift registers 5,6 the suitable input signals $I_{st}$ and $I_m$ are supplied, which are transported by means of the clock $\phi$ through the shift registers 5,6 each of the electrodes 3 and 4 can be clocked or be kept at a fixed voltage level according to desire.

Figure 11:
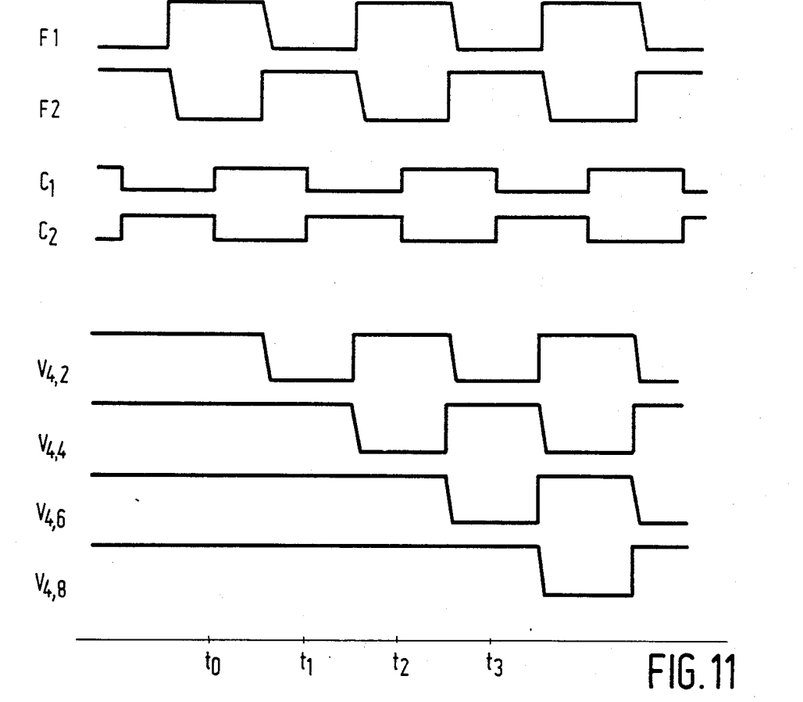
FIGS. 11 and 12 show the clock voltages to be applied in this arrangement as a function of the time t.

For illustration of the operation, in FIG. 11 the clock voltages $F_1$, $F_2$, $C_1$, $C_2$ and the electrode voltages V4,2; V4,4; V4,6 and V4,8 at the electrodes 4,2; 4,4 etc. are plotted as a function of the time t when at the end of an integration period the generated charge pattern is transferred from the sensor section to the storage section. It is assumed that the d.c. level which is supplied via the line D and is further briefly designated as the level D has the same values as the high voltage level of $F_1$, $F_2$. There is started from the situation in which all switches 21 are in that state in which the electrodes 4,2; 4,4; 4,6 are connected to the d.c. line D, as a result of which there is induced below these electrodes a potential well in which generated charge packets are stored.

At the instant $t_o$ (FIG. 11), the switch 21,1 reverses its state, as a result of which the connection between the electrode 4,2 and the d.c. line D is interrupted and the connection to the clock line $F_1$ is established. The packet stored below the electrode 4,2 is now transferred when $F_1$ becomes low. At $t_1$ the switch 21,2 is changed over, as a result of which the electrode 4,4 will also participate in the transport. In an analogous manner, at $t_2$ and $t_3$ the switches 21,3 and 21,4, respectively, are successively changed over, as a result of which the electrodes 4,6 and 4,8 are also connected to the clock lines $F_1$, $F_2$. The charge transport takes place in the same manner as in the first embodiment, illustrated in FIG. 3.

In the storage section the information is stored again below the electrodes 3,2; 3,4; 3,6 etc. by interrupting, starting from the electrode 3,2, successively the connection between the electrodes 3,2 and the clock lines $F_{1'}$, $F_{2'}$ and establishing the connection to the d.c. line D' when below the relevant electrode an information line is stored. In an analogous manner, when the whole quantity of information from the sensor section A has been transported, the switches 21,1; 21,2; 21,3 etc. can be changed over in order of succession, as a result of which the electrodes 4,2; 4,4; 4,6 etc. are connected again to the d.c. line D.

Figure 11A:
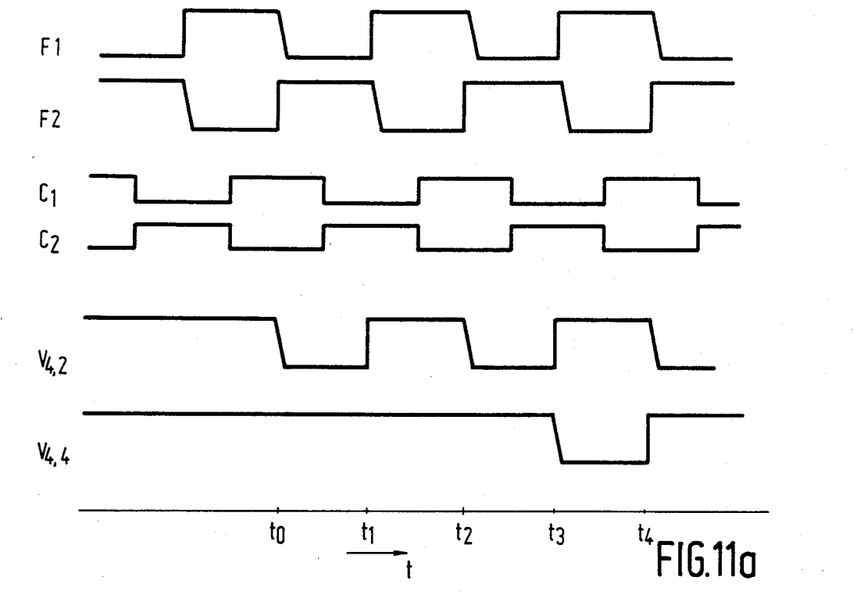

A second mode of operation of the arrangement shown in FIG. 9 is described with reference to FIG. 11a. Due to the fact that during the transport of the signal charges from the sensor section to the storage section radiation continues to be incident on the sensor section, charge can be added to the signal charge of each individual pixel, which originates from locations other than that associated with this pixel in the same column. This additional charge, which is further designated as "smear", can be compensated for at least for a considerable part by means of the method described herein. For an extensive description of this compensation method, reference may be made to the co-pending U.S. Patent Application "CCD image sensor arrangement" U.S. Ser. No. 282,848, the content of which is considered to be incorporated by reference in the present Application.

FIG. 11a again shows the clock voltages $F_1$, $F_2$, $C_1$ and $C_2$ and a function of the time t. These clock voltages are identical with regard to both frequency and amplitude to the corresponding clock voltages in FIG. 11. In this case, however, the shift register 6 is operated so that the frequency at which the switches 21 are changed over during the transport of the signal charges is one third compared with the preceding embodiment. The consequence thereof is illustrated in FIG. 11a for the voltages V4,2 and V4,4. In the same period preceding $t_o$, all storage electrodes 4,2'; 4,4 etc. are at the high level, as a result of which below these electrodes a potential well is induced in which signal charge is integrated. At $t_o$ the switch 21,1 is changed over and V4,2 follows the clock voltage $F_1$. If at $t_o$ V4,2 becomes low, the charge packet stored below this electrode is transported. The region below the electrode 4,2 is now empty. At $t_1$ V4,2 becomes high again, as a result of which below the electrode 4,2 a potential well is induced again. This well is not used for collecting the signal charge below the electrode 4,4, but is used for collecting smear charge that can be utilized as reference for the smear charge which is added to the signal of the pixel associated with the electrode 4,2. The potential well induced at $t_1$ is transported for this purpose as a separate bucket to the storage, during which transport charge is collected in this bucket, which charge is equal or at least substantially equal to the smear of the first signal charge. This reference charge is further stored as a normal charge packet in the storage, which should therefore be provided to this end with a sufficiently large number of storage locations. When during the read-out process the reference signal is subtracted from the signal charge enlarged by smear, the value of the signal charge can be accurately determined.

Figure 12:
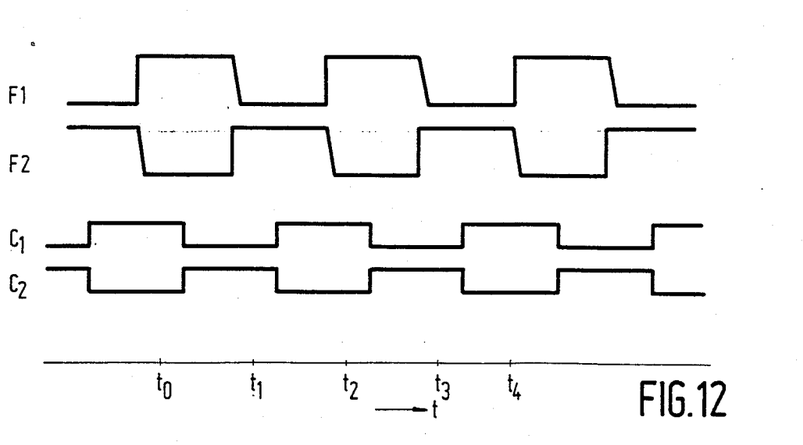
Figure 13:
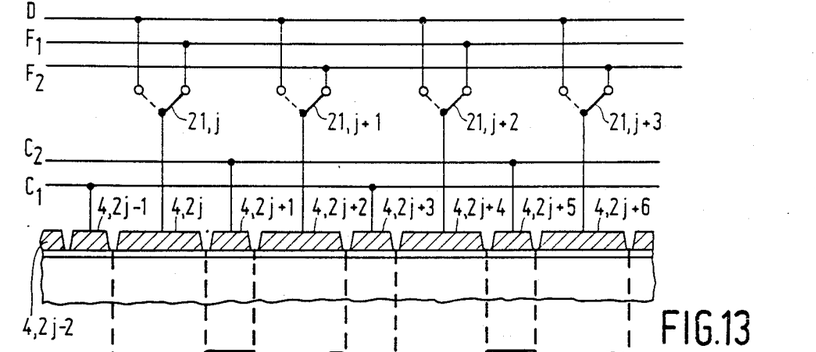
FIG. 13 is a sectional view of a part of the sensor section of this arrangement.
Figure 14:
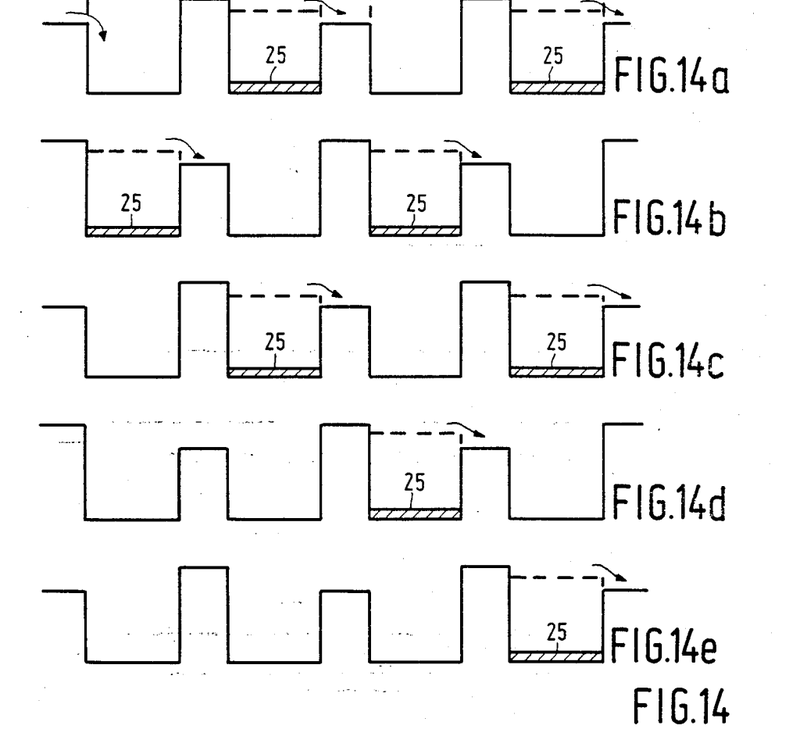
FIG. 14 shows the potential distribution at a number of instants during operation of this arrangement.

At $t_2$ the "empty" bucket is transported below the electrode 4,2. It is not until then that the switch 21,2 is changed over, as a result of which the electrode 4,4 is connected to $F_2$. At $t_3$, V4,4 becomes low, as a result of which the signal charge stored below the electrode 4,4 is transported to the electrode 4,2. At $t_4$ the voltage V4,4 at the electrode 4,4 becomes high again, as a result of which a potential well is induced again below this electrode. This potential well is used again for generating a reference signal and is therefore transported further as a practically empty bucket to the storage section. It is not until then that the switch 21,3 is changed over to transport the next signal packet. In an analogous manner, the remaining signal charges can be transported, while each time between two successive signal charges during the transport an additional charge packet is formed, which is used as reference for the smear charge. When all signal charges and reference charges have been stored in the storage section, the sensor section can be made ready for the next frame in the manner described above by connecting the electrodes 4,2; 4,4; etc. by means of the switches 21,1; 21,2 etc. successively to the d.c. line D. Preferably, at this stage the clocks $C_1$, $C_2$ are rotated through an angle of 180° with respect to the clock $F_1$ and $F_2$ as compared with the situation during the charge transport from the image sensor section to the storage section. For illustration, in FIG. 12 the voltages $F_1$, $F_2$, $C_1$ and $C_2$ are shown again as a function of the time t in the period after all signal charges have been transferred and the sensor section is made ready again for the next frame (compression of the accordion). FIGS. 13 and 14 show a part of the sensor section and the associated potential distributions $t_o$–$t_4$ (FIG. 12). In FIG. 14 full lines again indicate the surface potential occurring when the high voltage is applied to the storage electrodes 4,2j; 4,2j+2 etc.; broken lines indicate the surface potential occurring at the low voltage level. The arrows in the Figure indicate the charge transport. The shift register 6 is not shown in FIG. 13 for the sake of clarity. The cross-hatched regions in the potential wells in FIG. 14 represent smear charge, which as has been collected during the transport of the signal charges. It is assumed that the switches 21 are in that state in which the clock electrodes are connected to the clock lines $F_1$, $F_2$.

At the instant $t_o$, $F_1$ and $C_1$ are high and $F_2$ and $C_2$ are low. The potential distribution is then as shown in FIG. 14a. The charges 25 are not displaced, as during the transport of the signal charges, to the left, but are displaced to the right. At $t_1$, $F_1$ and $C_1$ are low and $F_2$ and $C_2$ are high, as a result of which the charge packets 25 located below the electrodes 4,2j and 4,2j+4 are shifted again one position to the right (FIG. 14b). When the charge has been transferred, the switch 21,j is changed over by means of the shift register 6 (not shown), as a result of which the electrode 4,2j is connected to the d.c. line D. At $t_2$, again $F_1$ and $C_1$ are high and $F_2$ and $C_2$ are low, as a result of which the charges 25 are again transported further to the right (FIG. 14c). If it is assumed that the storage electrode 4,2j−2 (shown only in part in the drawing), like the electrode 4,2j, is connected to the line D, in the potential well below the electrode 4,2j no charge will be transferred any longer during this step from the potential well below the electrode 4,2j−2. When the charge 25 below the electrodes 4,2j+2 has been transferred, the switch 21,j+1 can be changed over and can connect the electrode 4,2j+2 to the d.c. line D. In an analogous manner, the charge 25 is removed at $t_3$ and $t_4$, respectively (FIGS. 14d and e) below the electrodes 4,2j+4 and 4,2j+6, after which also the switches 21,j+2 and 21,j+4 can be changed over and can connect the associated electrodes to the d.c. line D.

When the charge packet 25 has arrived at the upper edge of the storage section A, it can be drained via a drain zone 26, which is indicated by broken lines in FIG. 9.

It should be noted that the arrangement has besides the advantage of a possible total reduction of smear, the additional advantage that the integration times can be made equal for all lines. The lowermost line of the sensor shown in FIG. 9 starts collecting signal charge as soon as the switch 21,1 connects the storage electrode 4,2 to the d.c. line D at an instant which lies a given interval before the instant at which the uppermost line starts integrating. At the end of the integration time, the lowermost line of signal charges is transported, while the uppermost line still integrates charge. By tuning the speed at which the accordion is extended (=speed of the transport of the signal charges from the sensor section to the storage section) and the speed at which the accordion is compressed to each other, it is possible in a simple manner for those skilled in the art to ensure that the integration times for all lines are equal to each other.

Figure 15:
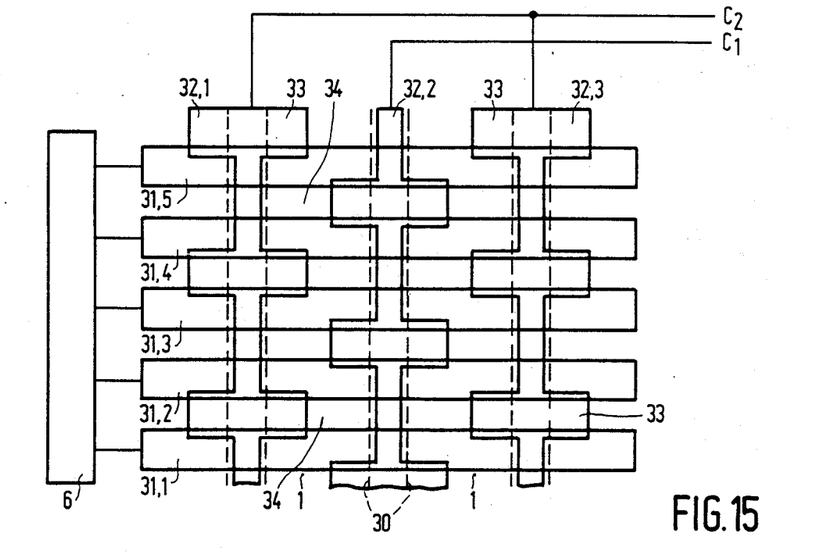
FIG. 15 is a diagrammatic plan view of a part of a third embodiment of an arrangement according to the invention.

In the embodiments described hitherto, the charge-coupled devices comprise charge transport channels which each extend along a straight line in the semiconductor body and a system of clock electrodes which all extend transversely to the longitudinal direction of the transport channels parallel to each other over the surface of the semiconductor body. However, the invention may also be used advantageously in other known embodiments of image sensor arrangements. By way of example, FIG. 15 shows the plan view of a part of the sensor section of a sensor having crossing electrodes according to the invention. Sensors having such crossing electrodes are known per se inter alia as cross-gate structure FT CCD's from the article "A Single Chip ½ Frame Transfer CCD Colour Image Sensor" by Mitani et al, published in Internat. Electron Devices Meeting 1984, p. 44–47 and in "The Journal of the Institute of Television Engineers in Japan" 1983, Vol. 37, No. 10, p. 769/775. The part shown in FIG. 15 which corresponds to the plan view of FIG. 2 of the first-mentioned publication again comprises vertical charge transport channels 1, of which only two are shown in the drawing. The channel separation 30 between the channels 1 is indicated by broken lines. The electrode system comprises horizontal electrodes 31 provided in a first polycrystalline silicon layer and vertical electrodes 32 provided in a second polycrystalline silicon layer. In order to distinguish them from each other, the electrodes are each further provided with a subscript 1,2,3 etc. The electrodes 31, 32 are mutually separated by an insulating layer. The electrodes 32 extend in the longitudinal direction of the channels along the whole length of the channels 1 mainly above the channel limiters 30 and are provided at the area of the storage locations in the channel with projections 33 extending above the channel. Due to this configuration, holes 34 not covered by electrode material are formed between the electrodes, as a result of which radiation can reach the semiconductor body without absorption by electrode material. As a result, more particularly the sensitivity to blue of the arrangement is improved. The semiconductor material at the area of the holes 34 can be doped with a suitable impurity in order to obtain a channel limiter. The channels 1 consequently have a more or less meandering structure.

In the same manner as the electrodes 4,2; 4,4 etc. in the arrangement shown in FIG. 1, the electrodes 31 are alternately connected to the shift register 6, while the electrodes 32,1 and 32,2 are connected, in an analogous manner as the electrodes 4,1; 4,3 etc. in the arrangement shown in FIG. 1, to the clocks $C_1$ and $C_2$. The arrangement can be operated in the same manner as the arrangement in the preceding embodiment. During the integration period, signal charge can be collected below each of the electrodes 31. These signal charges can each be transported with 4-phase transport to the storage (not shown in the Figure) by first transporting the packet below 31,1, then this packet and the packet below 32,2 etc. to the storage section. In the storage section, the charge packets formed in the sensor section can each be stored separately again before they are read out. As compared with the crossing gate structures described in the afore-mentioned publications, the sensor described here has double the number of pixels with unchanged surface area, i.e. a number of pixels equal to the number of horizontal electrodes present.

It will be appreciated that the invention is not limited to the embodiments described here, but that many further variations are possible for those skilled in the art without departing from the scope of the invention.

For example, in the embodiment last described, the smear suppression method described with reference to FIG. 9 may be used.

Instead of 2-phase shift registers 5,6, use may also be made of 4-phase shift registers.

Further, the invention may also be used in other types of image sensors and in line sensors.

What is claimed is:

1. A charge-coupled device comprising a semiconductor body, a charge transport channel defined in said semiconductor body and an electrode system for controlling the transport of charges through the charge transport channel, a shift register by means of which voltages can be applied to the electrode system such that during the storage of charge packets the device is operated as an m-phase device and is operated during transport as an n-phase device (n being larger than m), while a charge packet does not participate in the transport until the preceding charge packet has already been displaced over a given distance, said electrode system comprising a first group of electrodes coupled to said shift register and a second group of electrodes coupled to a common clock signal source, electrodes of said first group and electrodes of said second group being alternately arranged.

2. A charge-coupled device as claimed in claim 1, characterized in that the electrodes of the electrode system are alternately coupled to the shift register and to at least one clock signal source supply conductor common to a number of electrodes.

3. A charge-coupled device as claimed in claim 1, or 2, characterized in that said voltages are applied to the electrode system such that during the storage of charge packets a potential well is induced below the electrodes coupled to the shift register and a potential barrier is induced below the electrodes connected to said clock signal source.

4. A charge-coupled device as claimed in claim 1 or 2, characterized in that the second group of electrodes are alternately connected to a first and to a second clock signal source supply conductor.

5. A charge-coupled device as claimed in claim 4, characterized in that clock voltages are applied to the first and to the second clock signal source supply conductors whose phase is rotatable through a phase angle of 180° with respect to the clock voltages applied to the electrodes of said first group, as a result of which the transport direction of the charge transport in the charge transport channels can be reversed.

6. A charge-coupled device as claimed in claim 1 or 2, characterized in that the electrode system comprises two sets of crossing electrodes, a first set of electrodes extending transversely to the charge transport direction over the surface of the semiconductor body and a second set of electrodes extending parallel to the change transport direction over the surface, one of the two sets of electrodes comprising said first group of electrodes coupled to the shift register and the second of the two sets of electrodes being connected to one or more common clock signal source supply conductors.

* * * * *